United States Patent
Tsukamoto et al.

(10) Patent No.: US 9,829,529 B2
(45) Date of Patent: Nov. 28, 2017

(54) POWER SUPPLY APPARATUS

(71) Applicant: Nissan Motor Co., Ltd., Yokohama-shi, Kanagawa (JP)

(72) Inventors: Yukari Tsukamoto, Sagamihara (JP); Tsuyoshi Morita, Zama (JP)

(73) Assignee: Nissan Motor Co., Ltd., Yokohama (JP)

(*) Notice: Subject to any disclaimer, the term of this patent is extended or adjusted under 35 U.S.C. 154(b) by 57 days.

(21) Appl. No.: 14/411,132

(22) PCT Filed: Jun. 26, 2013

(86) PCT No.: PCT/JP2013/067461
§ 371 (c)(1),
(2) Date: Dec. 24, 2014

(87) PCT Pub. No.: WO2014/027512
PCT Pub. Date: Feb. 20, 2014

(65) Prior Publication Data
US 2015/0192630 A1  Jul. 9, 2015

(30) Foreign Application Priority Data
Aug. 14, 2012  (JP) ................. 2012-179789

(51) Int. Cl.
*G01R 31/02* (2006.01)
*G01R 31/40* (2014.01)
*G01R 31/36* (2006.01)

(52) U.S. Cl.
CPC ....... *G01R 31/025* (2013.01); *G01R 31/3606* (2013.01); *G01R 31/40* (2013.01)

(58) Field of Classification Search
CPC .............. G01R 31/3606; G01R 31/362; G01R 31/3648; G01R 31/3624
(Continued)

(56) References Cited

U.S. PATENT DOCUMENTS 2,376,232 A * 5/1945 Cummings .......... G01R 31/021
324/541
3,131,347 A * 4/1964 Brooks ................ G01R 31/022
324/514
(Continued)

FOREIGN PATENT DOCUMENTS

CN         101228447 A    7/2008
EP           1921457 A1   5/2008
(Continued)

OTHER PUBLICATIONS

Cuzner, Robert M., and Giri Venkataramanan. "The status of DC micro-grid protection." Industry Applications Society Annual Meeting, 2008. IAS'08. IEEE. IEEE, 2008.*

*Primary Examiner* — Jermele M Hollington
*Assistant Examiner* — Christopher McAndrew
(74) *Attorney, Agent, or Firm* — Global IP Counselors, LLP

(57) ABSTRACT

A battery power supply device includes an alternating-current power source, a secondary cell connected to the alternating-current power source, a first switch for selectively connecting or cutting off a cell and the alternating-current power source, the first switch being disposed between the battery and the alternating-current power source, and a ground fault sensing device for sensing a ground fault in the battery, the ground fault sensing device being connected closer to the battery than the first switch; the ground fault sensing device sensing a ground fault in the battery when the first switch is off.

21 Claims, 6 Drawing Sheets

(58) Field of Classification Search
USPC .......................................................... 324/426
See application file for complete search history.

(56) References Cited

U.S. PATENT DOCUMENTS

| | | | | | |
|---|---|---|---|---|---|
| 4,410,925 | A * | 10/1983 | Tucker | ..................... | H02H 3/17 361/42 |
| 6,930,868 | B2 * | 8/2005 | Kondo | ................... | H02H 3/337 361/42 |
| 8,513,951 | B2 * | 8/2013 | Wunderlich | ......... | G01R 31/025 324/500 |
| 8,599,523 | B1 * | 12/2013 | Ostrovsky | ............ | G01R 31/025 361/45 |
| 8,659,858 | B2 * | 2/2014 | Matsuo | ................ | G01R 31/025 361/42 |
| 9,046,559 | B2 * | 6/2015 | Lindsay | ................ | B60L 3/0046 |
| 9,103,890 | B2 * | 8/2015 | Sugimura | .......... | G01R 31/3606 |
| 2005/0280422 | A1 * | 12/2005 | Kishibata | ............. | G01R 31/025 324/522 |
| 2006/0212235 | A1 * | 9/2006 | Kolker | ................ | G01R 31/025 702/58 |
| 2007/0008666 | A1 * | 1/2007 | Morita | .................. | B60L 3/0023 361/42 |
| 2007/0177325 | A1 * | 8/2007 | Zandonella Balco | . | H02H 3/335 361/118 |
| 2008/0164880 | A1 * | 7/2008 | Jaeger | ................ | G01R 31/3658 324/426 |
| 2009/0147414 | A1 * | 6/2009 | Lazarovich | .......... | G01R 31/025 361/42 |
| 2011/0210747 | A1 * | 9/2011 | Heo | ................... | G01R 31/3658 324/434 |
| 2012/0001640 | A1 * | 1/2012 | Hashimoto | ........... | B60L 3/0069 324/434 |
| 2012/0013306 | A1 * | 1/2012 | Kadirvel | ............ | G01R 31/3606 320/134 |
| 2013/0200713 | A1 * | 8/2013 | Ikawa | ..................... | H02H 3/18 307/80 |
| 2014/0167779 | A1 * | 6/2014 | Si | ........................... | G01R 31/42 324/509 |
| 2014/0347897 | A1 * | 11/2014 | Broussard | ................ | H02J 3/36 363/35 |
| 2014/0361784 | A1 * | 12/2014 | Satoh | ................... | G01R 31/025 324/509 |

FOREIGN PATENT DOCUMENTS

| | | |
|---|---|---|
| EP | 2477040 A1 | 7/2012 |
| JP | 7-274303 A | 10/1995 |
| JP | 2002-140123 A | 5/2002 |
| JP | 2003-169401 A | 6/2003 |
| JP | 2004-138434 A | 5/2004 |
| JP | 2008-58085 A | 3/2008 |
| JP | 2010-145376 A | 7/2010 |
| JP | 2012-39796 A | 2/2012 |

* cited by examiner

POWER SUPPLY APPARATUS

CROSS-REFERENCE TO RELATED APPLICATIONS

This application is a U.S. National stage application of International Application No. PCT/JP2013/067461 filed, Jun. 26, 2013, which claims priority to Japanese Patent Application No. 2012-179789 filed in Japan on Aug. 14, 2012, the contents of each of which are hereby incorporated herein by reference.

BACKGROUND

Field of the Invention

The present invention relates to a power supply device.

Background Information

A conventional ground fault detection device for detecting ground faults in a direct-current power source grid includes a battery group, in which a detection resistor and a coupling capacitor for direct-current cutoff are connected between a pulse signal generating means or device and a ground fault detection terminal connected to a direct-current negative electrode feed line, and a reduction in insulation resistance during a ground fault is sensed from the difference between a reference voltage and the detected voltage of a pulse signal occurring at a point of connection of the detection resistor and the coupling capacitor (Japanese Laid-Open Patent Application No. 2004-138434).

SUMMARY

However, in a power supply system in which the direct-current power source grid described above is connected to alternating-current grid electric power via an inverter, and a direct-current power source is charged by the alternating-current grid electric power, the alternating-current grid electric power is grounded. The conventional ground fault detection device described above therefore has the drawback of being incapable of sensing a reduction in insulation resistance during a ground fault.

An object of the present invention is to provide a power supply device including a grounded alternating-current power source and a secondary cell connected to the alternating-current power source, the power supply device being capable of detecting a ground fault in the secondary cell.

In the present invention for achieving the abovementioned object, a first switch for selectively connecting or cutting off a secondary cell and an alternating-current power source is connected between the secondary cell and the alternating-current power source, a ground fault sensing means (device) for sensing a ground fault in the secondary cell is connected closer to the secondary cell than the first switch, and a ground fault in the secondary cell is sensed by the ground fault sensing means in a state in which the first switch is off.

Through the present invention, a grounding portion of the alternating-current power source and a circuit portion for sensing of a ground fault in the secondary cell by the ground fault sensing means are cut off by the turning off of the first switch. A ground fault in the secondary cell can therefore be sensed without affecting the grounding of the alternating-current power source.

BRIEF DESCRIPTION OF THE DRAWINGS

Referring now to the attached drawings which form a part of this original disclosure.

DETAILED DESCRIPTION OF EMBODIMENTS

Embodiments of the present invention will be described below with reference to the drawings.

First Embodiment

Figure 1:
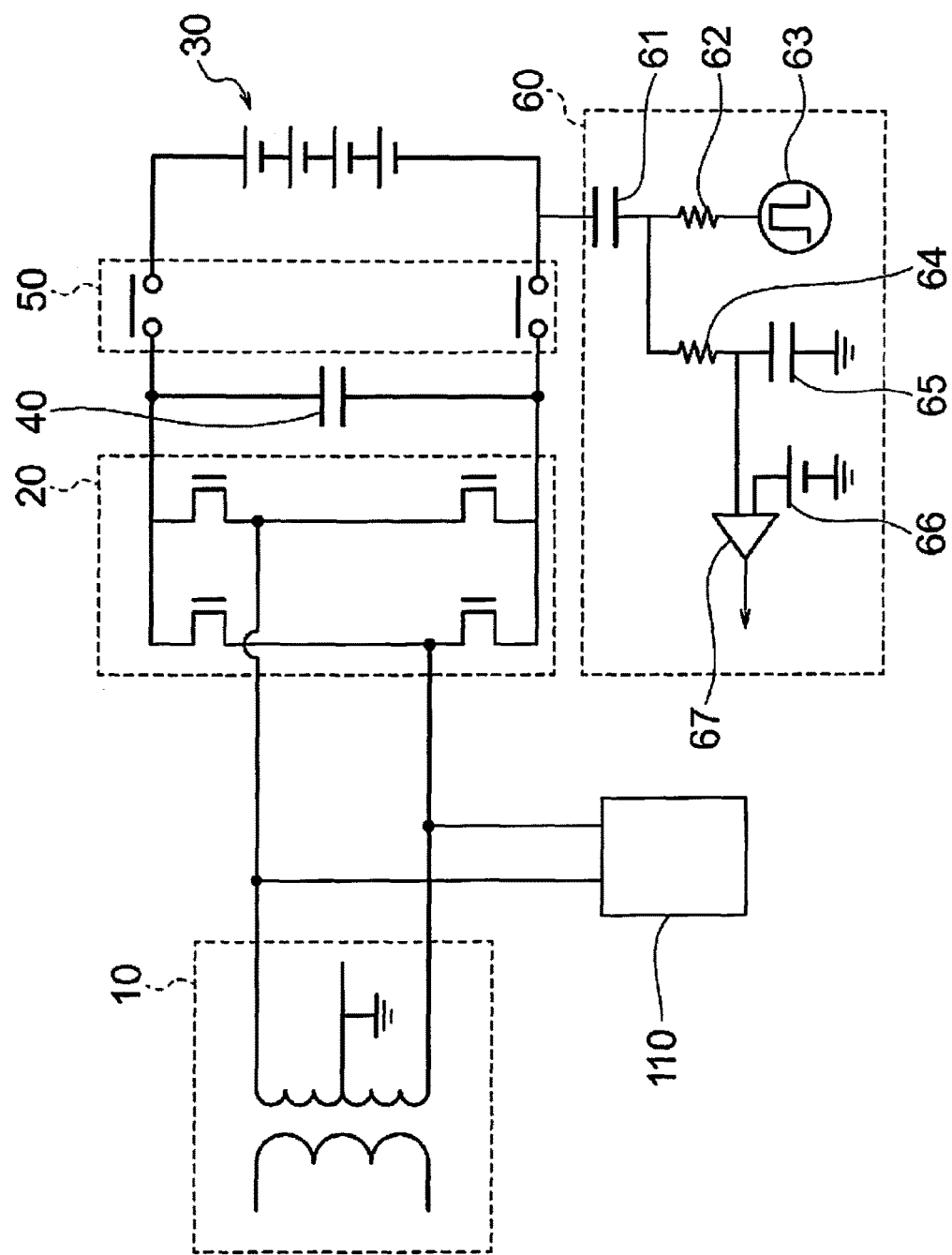
FIG. 1 is a circuit diagram of the power supply system including the power supply device according to an embodiment of the present invention.

FIG. 1 is a circuit diagram illustrating the power supply system of the power supply device according to an embodiment of the present invention. The power supply device of the present example is applied to a household or commercial power supply system which uses an alternating-current power source as one current source.

The power supply system including the power supply device of the present example is provided with an alternating-current power source 10, a power converter 20, a battery (secondary cell) 30, a smoothing capacitor 40, a relay switch 50 (first switch), and a ground fault sensing circuit 60. The alternating-current power source 10 is an electric power source for supplying electric power to a load not illustrated in the drawing, and is also an electric power source for supplying charging electric power to the battery 30 via the power converter 20. The alternating-current power source 10 includes a transformer, and is grounded by connecting a neutral point of the secondary side of the transformer to ground. The transformer is a common transformer provided to a household or facility to transform alternating-current electric power supplied from a power company for output, for example.

The power converter 20 is an AC/DC conversion circuit in which a plurality of switching elements is connected in bridged fashion, and is a conversion circuit for converting alternating-current electric power supplied from the alternating-current power source 10 into direct-current electric power and supplying the direct-current electric power to the battery 30. The power converter 20 converts direct-current electric power outputted from the battery 30 into alternating-current electric power and supplies electric power to a load 110. The power converter 20 is connected to a pair of power supply lines connected to the alternating-current power source 10 and is connected between the alternating-current power source 10 and the battery 30.

The battery 30 is a storage cell in which a plurality of lithium-ion cells or other secondary cells is connected. In the power supply system of the present example, the battery 30 is a cell for storing electric power to be supplied to a load not illustrated in the drawing. In the present example, electric power is controlled so that the battery 30 is charged by electric power from the alternating-current power source 10 during late-night hours in which electric utility rates are inexpensive, and the electric power saved in the battery 30 is supplied to a load during daytime hours, for example.

The smoothing capacitor 40 is a capacitor for rectifying the electric power supplied to the battery 30 from the power converter 20, and is connected between the positive-electrode side and negative-electrode side of the pair of power supply lines, and connected between the power converter 20 and the relay switch 50.

The relay switch 50 is a switch for providing conduction and cutoff between the battery 30 and the alternating-current power source 10, and is connected between the power converter 20 and the battery 30. When the relay switch 50 is off, electric power from the battery 30 is not supplied to the power converter 20, and electric power from the power converter 20 is not supplied to the battery 30.

The ground fault sensing circuit 60 is a circuit for sensing a ground fault in the battery 30, and is connected on the battery 30 side of the relay switch 50. In the example illustrated in FIG. 1, the ground fault sensing circuit 60 is connected to an electric power line for connecting a negative electrode of the battery 30 and a junction on the negative-electrode side of the relay switch 50. In other words, the ground fault sensing circuit 60 is connected between the battery 30 and the relay switch 50, and when the relay switch 50 is off, the ground fault sensing circuit 60 therefore becomes able to sense a ground fault (i.e., a decrease in insulation resistance) by detecting the insulation resistance of the battery 30. When the relay switch 50 is on, conduction occurs to the ground of the alternating-current power source 10 via the relay switch 50 and the power converter 20, and it is therefore impossible to distinguish whether the smallness of the detected insulation resistance is due to a decrease in insulation resistance of the battery 30 or a decrease in insulation resistance due to grounding of the alternating-current power source 10, and a ground fault in the battery 30 cannot be sensed.

The ground fault sensing circuit 60 has capacitors 61, 65, resistors 62, 64, a pulse transmitter 63, and a comparator 67. One end of the capacitor 61 is connected to the battery 30 (to an electric power line connected to an electrode terminal of the battery 30), and the other end is connected to the pulse transmitter 63 via the resistor 62. In other words, the pulse transmitter 63 is connected to the power supply line via a series circuit of the capacitor 61 and the resistor 62. A low-pass filter comprising the series circuit of the resistor 64 and the capacitor 65 is connected to the connection point (measurement point) between the capacitor 61 and the resistor 62. The input side of the comparator 67 is connected to a reference voltage 66 and the connection point between the resistor 64 and the capacitor 65, and the output side of the comparator 67 is connected to a controller described hereinafter.

In the case of sensing a ground fault in the battery 30 through use of the ground fault sensing circuit 60, a pulse which is a voltage signal having a predetermined amplitude is outputted from the pulse transmitter 63 and inputted to the battery 30 (to an electric power line connected to an electrode terminal of the battery 30) via the capacitor 61. A voltage variation at the other-end side of the capacitor 61, i.e., on the side of the point of connection to the resistor 62 (at the measurement point), in accordance with the insulation resistance of the battery 30 is manifested as an amplitude variation in the input voltage inputted to a comparator 67. Therefore, by comparing the amplitude voltage and the reference voltage, the ground fault sensing circuit 60 determines whether the insulation resistance of the battery 30 has decreased. The reference voltage is a voltage threshold value set in advance that corresponds to the insulation resistance for sensing a ground fault in the battery 30. In other words, the amplitude (amplitude voltage) of the input voltage inputted to the comparator 67 corresponds to the insulation voltage, and a decrease in the insulation resistance of the battery 30 (a ground fault) is therefore detected by comparing the amplitude voltage with the reference voltage. In brief, the ground fault sensing circuit 60 can also be considered to detect the insulation resistance (i.e., the amplitude voltage) and compare the detected insulation resistance with an insulation resistance that serves as a reference for sensing a ground fault (i.e., a reference voltage) to sense the occurrence of a ground fault.

When a ground fault is not occurring in the battery 30, the amplitude voltage (response voltage) inputted to the comparator 67 is higher than the reference voltage. When a ground fault is occurring in the battery 30, the insulation resistance of the battery 30 decreases (e.g., substantially to zero), and the amplitude voltage inputted to the comparator 67 is therefore lower than the reference voltage. The ground fault sensing circuit 60 thereby senses a ground fault in the battery 30 by comparing the reference voltage and the amplitude voltage for the input pulse of the pulse transmitter 63. The load 110 is an electrical equipment load provided to a household or facility that is driven by alternating-current electric power from the alternating-current power source 10 or alternating-current electric power outputted from the power converter 20.

Figure 2:
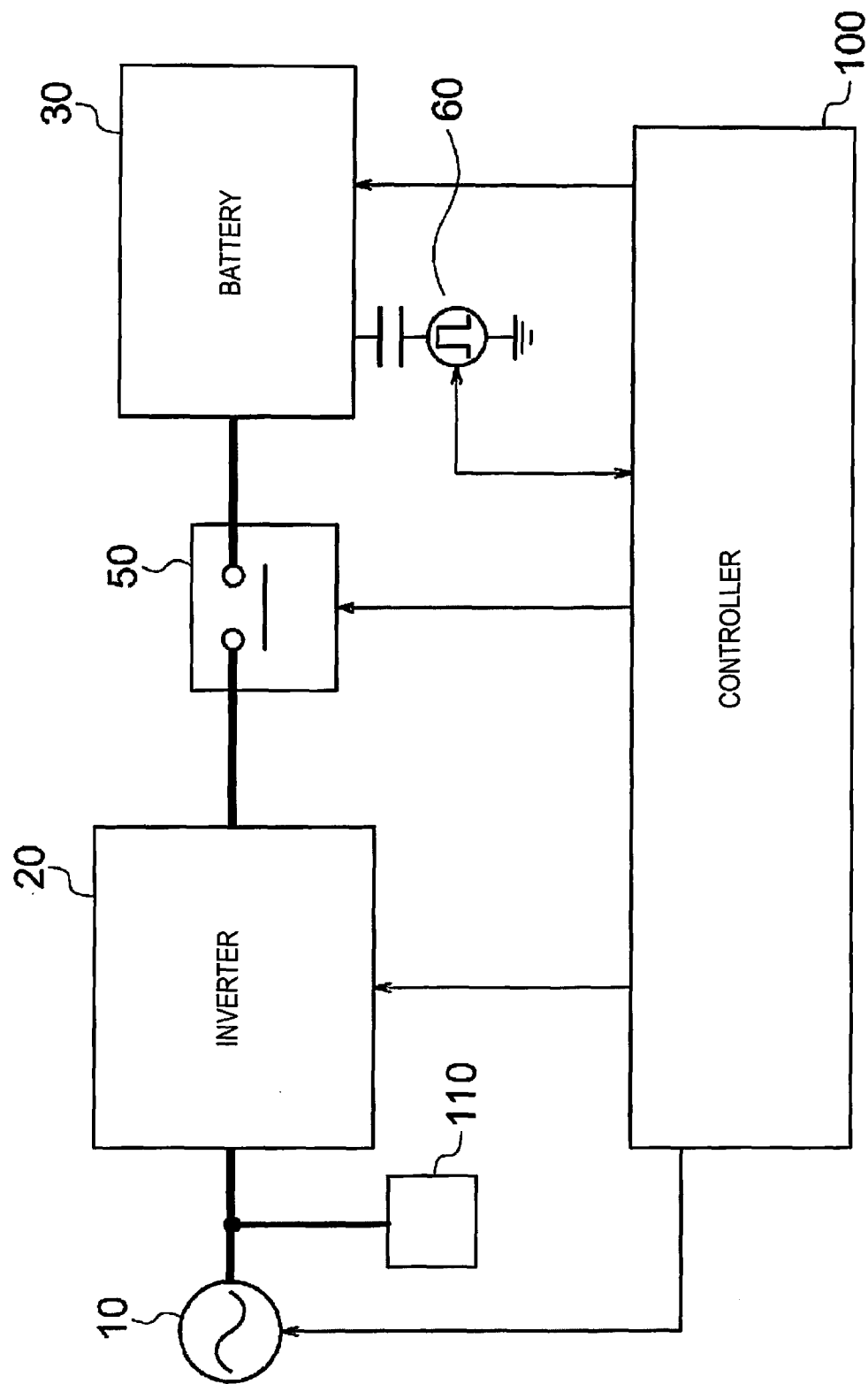
FIG. 2 is a block diagram of the power supply system in FIG. 1.

The electric power grid of the power supply system of the present example will next be described using FIG. 2. FIG. 2 is a block diagram illustrating the electric power grid of the power supply system of FIG. 1. In FIG. 2, thick lines indicate electric power lines (power supply lines) and arrows indicate signal lines.

The alternating-current power source 10, the power converter 20, the relay switch 50, the load 110, and the battery 30 are connected by electric power lines. A controller 100 controls the alternating-current power source 10, the power converter 20, the battery 30, the relay switch 50, and the ground fault sensing circuit 60, and is connected by signal lines.

Control of the power supply system of the present example will next be described. The controller 100 switches between a normal control mode and a ground fault sensing mode for sensing a ground fault in the battery 30, and controls the relay switch 50 and other components. The normal control mode will first be described.

In the normal control mode, the controller 100 turns on the relay switch 50 and creates a state in which electric power from the battery 30 is supplied to the load 110 (via the power converter 20), electric power from the alternating-current power source 10 is supplied to the battery 30 (via the power converter 20), and it is possible to charge the battery 30. The controller 100 controls the alternating-current power source 10, the power converter 20, and the battery 30 in accordance with the demand electric power, a time block, or another factor that corresponds to the usage status of the load. For example, in daytime or other time blocks in which electric utility rates are high, the controller 100 supplies electric power from the battery 30 to the load 110. When the amount of electric power demanded by the load 110 is large and cannot be covered solely by the electric power of the battery 30, the controller 100 supplies electric power from the alternating-current power source 10 to the load 110 in addition to the electric power of the battery 30.

In time blocks in which electric utility rates are low, the controller 100 charges the battery 30 while supplying electric power from the alternating-current power source 10 to the load 110. During charging of the battery 30, the controller 100 manages the charging state of the battery 30 and controls the charging electric power supplied from the power converter 20 to the battery 30 so that the battery 30 is not overcharged. The controller 100 thereby manages electric power in the power supply system of the present example.

The ground fault sensing mode will next be described. In a state in which the relay switch 50 is on as described above, when a pulse is issued from the pulse transmitter 63, voltages are compared by the comparator 67, and the insulation resistance of the battery 30 is thereby detected in order for the ground fault sensing means 60 to sense a ground fault in the battery 30, grounding of the alternating-current power source 10 causes the amplitude voltage inputted to the comparator 67 to fall below the voltage threshold value. The insulation resistance of the battery 30 therefore decreases even when there is no ground fault in the battery 30, and it is possible for a ground fault in the battery 30 to be erroneously sensed. Control is therefore performed in the present example so that the relay switch 50 is placed in the off state prior to ground fault sensing by the ground fault sensing circuit 60.

When the ground fault sensing mode is to be executed, the controller 100 first confirms the on or off state of the relay switch 50. When the relay switch 50 is off, the controller 100 activates the ground fault sensing circuit 60 and senses a ground fault in the battery 30 by measuring the insulation resistance of the battery 30.

During execution of the ground fault sensing mode, when the relay switch 50 is on, the controller 100 detects the electric current flowing through the relay switch 50 and determines whether the detected electric current is lower than a predetermined electric current threshold value. The electric current threshold value is set in advance and is an electric current having the threshold value necessary for turning off the relay switch 50. The detected electric current may be detected by connecting an electric current sensor to the power supply line to which the relay switch 50 is connected. Alternatively, since the electric power of the alternating-current power source 10 and the charging/discharging electric power of the battery 30 are controlled in accordance with the demand electric power of the load, the controller 100 may detect the electric current flowing to the relay switch 50 from the charging/discharging electric power of the battery 30.

When the detected electric current in the relay switch 50 is lower than the electric current threshold value (e.g., when the detected electric current is substantially zero), the relay switch 50 is turned off, and even when the supply of electric power from the battery 30 to the load 110 is cut off, because the decrease in electric power supplied to the load 110 due to the cutoff is small, the load 110 can be driven by the electric power from the alternating-current power source 10. When the battery 30 is being charged, the battery 30 may be charged after ground fault sensing is completed. Consequently, when the detected electric current in the relay switch 50 is lower than the electric current threshold value, the controller 100 turns off the relay switch 50, activates the ground fault sensing circuit 60, and performs ground fault detection in the battery 30.

When the detected electric current in the relay switch 50 is equal to or greater than the electric current threshold value, the controller 100 detects the electric current in the relay switch 50 while leaving the relay switch 50 in the on state. At the instant that the detected electric current in the relay switch 50 becomes lower than the electric current threshold value, the controller 100 turns off the relay switch and senses ground faults in the battery 30.

When it is assessed that a ground fault is occurring in the battery 30, the controller 100 restricts charging and discharging of the battery 30 by maintaining the relay switch 50 in the off state while notifying a user that a ground fault has occurred.

Figure 3:
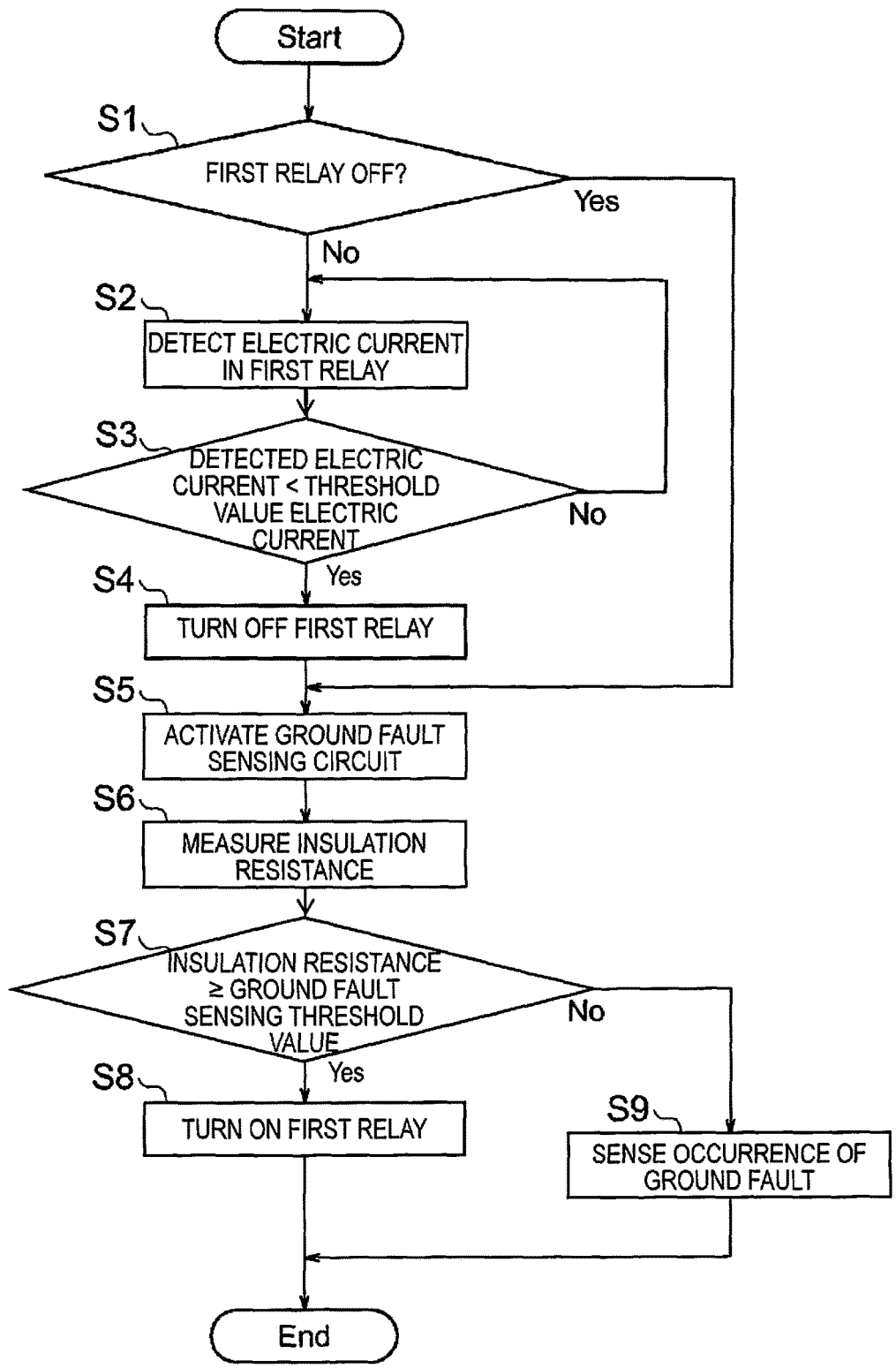
FIG. 3 is a flowchart illustrating the procedure of control performed by the controller of FIG. 2.

The procedure of control by the controller 100 in the ground fault sensing mode will next be described using FIG. 3. FIG. 3 is a flowchart illustrating the procedure of control by the controller 100.

The controller 100 performs the control process illustrated in FIG. 3 when executing the ground fault sensing mode. First, in step S1, the controller 100 confirms whether the relay switch 50 (first switch) is off. When the relay switch 50 is off, the process proceeds to step S5.

When the relay switch 50 is not off, the controller 100 detects the electric current in the relay switch 50 (step S2). In step S3, the controller 100 compares the detected electric current in the relay switch 50 and the electric current threshold value. When the detected electric current in the relay switch 50 is equal to or greater than the electric current threshold value, the process returns to step S2, and the electric current in the relay switch 50 is again detected.

When the detected electric current is lower than the electric current threshold value, the controller 100 turns off the relay switch 50 (step S4).

In step S5, the controller 100 activates the ground fault sensing circuit 60. In step S6, the ground fault sensing circuit 60 measures the insulation resistance of the battery 30 by measuring the response voltage for the pulse of the pulse transmitter 63.

In step S7, the ground fault sensing circuit 60 detects whether the insulation resistance is equal to or greater than a ground fault sensing threshold value by comparing the corresponding response voltage and the reference voltage through use of the comparator 67. The ground fault sensing threshold value corresponds to the reference voltage 66. When the insulation resistance is equal to or greater than the ground fault sensing threshold value, the controller 100 in step S8 assesses that there is no ground fault in the battery 30, turns on the relay switch 50, and ends the ground fault sensing mode.

When the insulation resistance is less than the ground fault sensing threshold value, the controller 100 in step S9 assesses from the result of comparison by the comparator 67 that a ground fault is occurring in the battery 30, notifies the user that a ground fault has occurred, and ends the ground fault sensing mode.

As described above, in the present example, a ground fault in the battery 30 is sensed by the ground fault sensing circuit 60 when the relay switch 50 connected between the alternating-current power source 10 and the battery 30 is off. In the present example, a ground fault in the battery 30 can thereby be sensed in a power supply device for supplying electric power from the grounded alternating-current power source 10 to the battery 30 via the power converter.

In a possible method for sensing a ground fault in the battery 30, a ground fault is sensed by an operator using a megohm tester after placing the battery 30 in an insulated state (a state in which the alternating-current power source 10 and the battery 30 are electrically isolated). However, because a ground fault can be sensed without use of a megohm tester in the present example, the number of man-hours involved in ground fault sensing can be reduced.

In another possible method, during ground fault sensing in the battery 30, ground fault sensing in the battery 30 is performed after a transformer has been provided between the power converter 20 and the battery 30 in order to ensure an insulated state in the battery 30. However, when a transformer is provided, the size of the system is increased, cost of the power supply device increases, and the operating noise of the power supply device become significant. However, an insulated state is ensured in the present example by turning of the relay switch 50, and the abovementioned transformer can therefore be omitted.

In the present invention, the controller 100 turns off all of the plurality of switching elements included in the power converter 20, and ground fault sensing in the battery 30 may therefore be performed by the ground fault sensing circuit 60 in a state in which the alternating-current power source 10 and the battery 30 are electrically isolated from each other. When the plurality of switching elements of the power converter 20 are turned off, the ground fault sensing circuit 60 is cut off from the alternating-current power source 10, and it is therefore possible to prevent the ground fault sensing circuit 60 from erroneously sensing the grounding of the alternating-current power source 10 as a ground fault in the battery 30.

In the present invention, the controller 100 may also be caused to turn off the relay switch 50 at a predetermined cycle, and control the ground fault sensing circuit 60 to sense ground faults in the battery 30. The predetermined cycle is set in advance, and is set to one day (24 hours), for example. It is thereby possible to periodically perform ground fault sensing in the battery 30 in the present example.

The timing at which the relay switch 50 is turned off at a predetermined cycle may be set to late-night hours, for example, in which charging/discharging control of the battery 30 is not being performed.

In the present invention, the controller 100 may measure the time elapsed from the last time ground fault sensing was performed, and when the measured elapsed time exceeds a limit time set in advance, the controller 100 may turn off the relay switch 50 and cause ground faults in the battery 30 to be sensed. Measurement of the elapsed time may be reset when the detected electric current in the relay switch 50 falls below the electric current threshold value and ground fault sensing is performed before the measured elapsed time has exceeded the limit time. It is thereby possible to periodically perform ground fault sensing in the battery 30 in the present example.

Specifically, the controller 100 turns off the relay switch 50 and causes ground faults in the battery 30 to be sensed at least once per a predetermined time. Through this configuration, even in a continued state in which the relay switch 50 is on, the relay switch 50 can be turned off and ground faults in the battery 30 can be sensed. As a result, a highly safe system can be provided.

In the present example, when the time block in which the alternating-current power source 10 is used is a nighttime electric power time block (an intra-day time block in which electric utility rates decrease), the controller 100 may turn off the relay switch 50, and ground faults in the battery 30 may be sensed by the ground fault sensing circuit 60. Through this configuration, since the relay switch 50 is turned off during the nighttime electric power time block for the battery 30, ground faults in the battery 30 can be sensed while the effect of using the alternating-current power source 10 on the electric utility rate is minimized when the amount of electric power that cannot be supplied to the load 110 from the battery 30 is supplemented by electric power from the alternating-current power source 10. As a result, a highly safe system can be provided without increasing the economic burden on the user.

The abovementioned relay switch 50 corresponds to the "first switch" of the present invention, the ground fault sensing circuit 60 corresponds to the "ground fault sensing means" of the present invention, and the controller 100 corresponds to the "control means or device" of the present invention.

Second Embodiment

Figure 4:
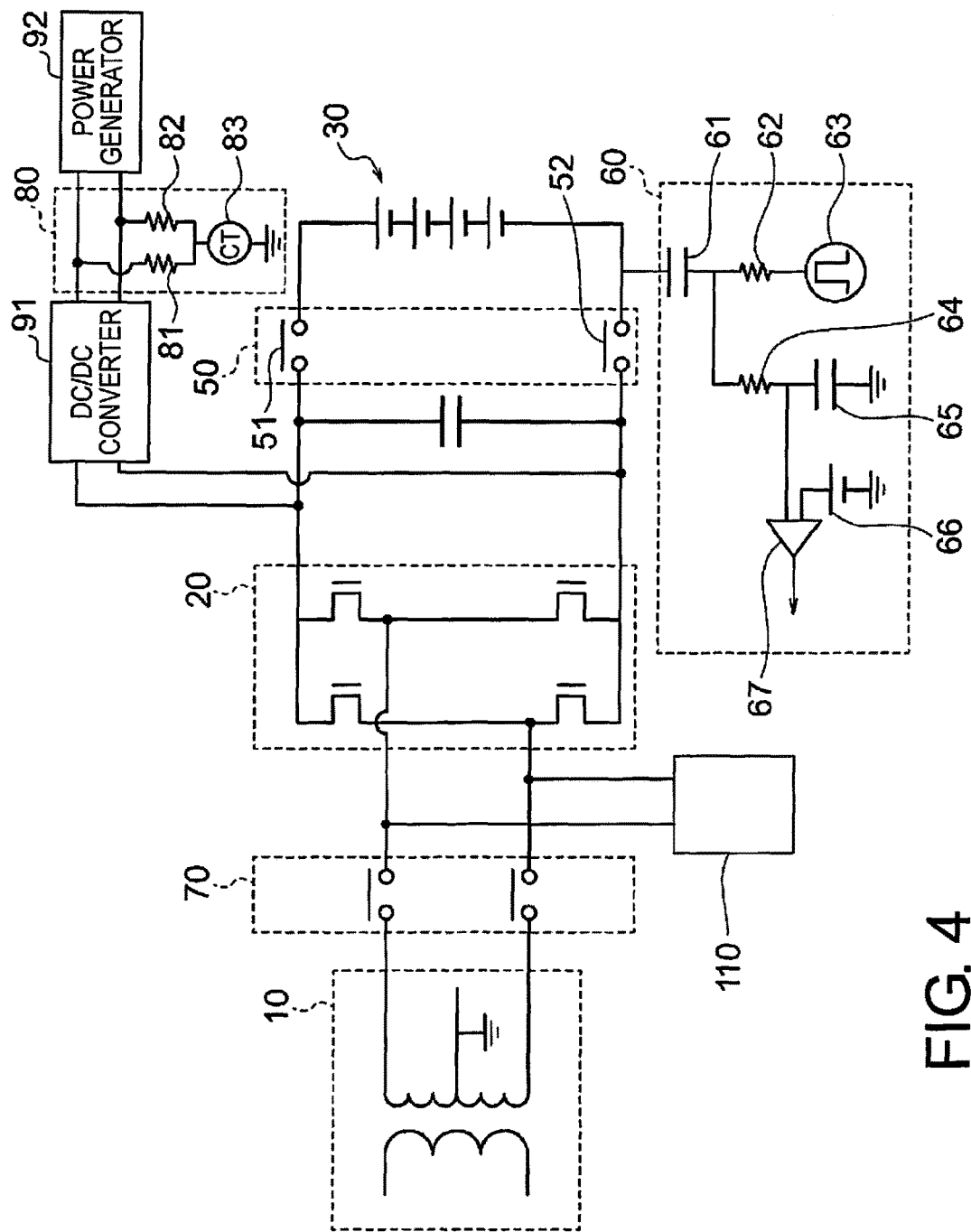
FIG. 4 is a circuit diagram of the power supply system including the power supply device according to another embodiment of the present invention.

FIG. 4 is a circuit diagram illustrating the power supply system of the power supply device according to another embodiment of the present invention. The present example differs from the first embodiment in that a relay switch 70, an electricity leakage sensing circuit 80, a DC/DC converter 91, and a power generator 92 are provided. All other aspects of the configuration of the second embodiment are the same as in the first embodiment, and descriptions thereof will therefore be quoted as appropriate.

As illustrated in FIG. 4, the power supply system including the power supply device of the present example is provided with an alternating-current power source 10, a power converter 20, a battery 30, a smoothing capacitor 40, a relay switch 50 (first switch), a ground fault sensing circuit 60, a relay switch 70 (second switch), an electricity leakage sensing circuit 80, a DC/DC converter 91, a power generator 92, and a load 110. The configurations and connection relationships of the alternating-current power source 10, the power converter 20, the battery 30, the smoothing capacitor 40, the relay switch 50 (first switch), and the ground fault sensing circuit 60 are the same as in the power supply system according to the first embodiment, and therefore will not be described.

The relay switch 70 is provided in order to cut off the circuit on the reverse side of the power converter 20 from the alternating-current power source 10, i.e., the circuit including the battery 30, the relay switch 50, the ground fault sensing circuit 60, and the electricity leakage sensing circuit 80, from the alternating-current power source 10. The relay switch 70 is connected between the alternating-current power source 10 and the power converter 20, and is provided to a power supply line. The load 110 is connected between the relay switch 70 and the power converter 20 on the power supply line.

The electricity leakage sensing circuit 80 is a circuit for sensing electricity leakage in the power generator 92. The electricity leakage sensing circuit 80 is connected closer to the power converter 20 than the relay switch 50 via the DC/DC converter 91, and is connected to each of a pair of power supply lines connected between the battery 30 and the power converter 20.

The electricity leakage sensing circuit 80 has resistors 81, 82 and an electric current sensor 83. The resistor 81 is connected to the power supply line on the positive-electrode side, and the resistor 82 is connected to the power supply line on the negative-electrode side. The electric current sensor 83 is connected to each of the resistors 81, 82 and is grounded. The electric current sensor 83 detects the electric current on the positive-electrode side from the electric current flowing to the resistor 81, and detects the electric current on the negative-electrode side from the electric current flowing to the resistor 82.

When electricity leakage occurs in the power generator 92, the electric current difference between the electric current flowing to the resistor 81 and the electric current flowing to the resistor 82 is higher than a predetermined electric current threshold value. Therefore, in the present example, the electric current on the positive-electrode side of the power generator 92 and the electric current on the negative-electrode side of the power generator 92 are detected using the electricity leakage sensing circuit 80, the deviation of these electric currents is measured, and when the electric current deviation is higher than the electric current threshold value set in advance, it is assessed that electricity leakage is occurring in the power generator 92.

The DC/DC converter 91 is connected between the power generator 92 and the power converter 20, and is a conversion circuit for converting the electric power generated by the power generator 92 and supplying the electric power to the inverter 20 and the battery 30.

The power generator 92 uses a self-generation function, and is configured from solar power generation or a fuel cell, for example. Specifically, the power supply system of the present example includes the alternating-current power source 10 and the battery 30, and the power generator 92 as a third electric power source. The power generator 92 functions as an electric power source for supplying electric power to the load 110, and functions also as an electric power source for charging the battery 30. Through this configuration, a parallel circuit is formed from the battery 30 and the power generator 92, and this parallel circuit is connected to the alternating-current power source 10 via the relay switch 70 in the present example.

Figure 5:
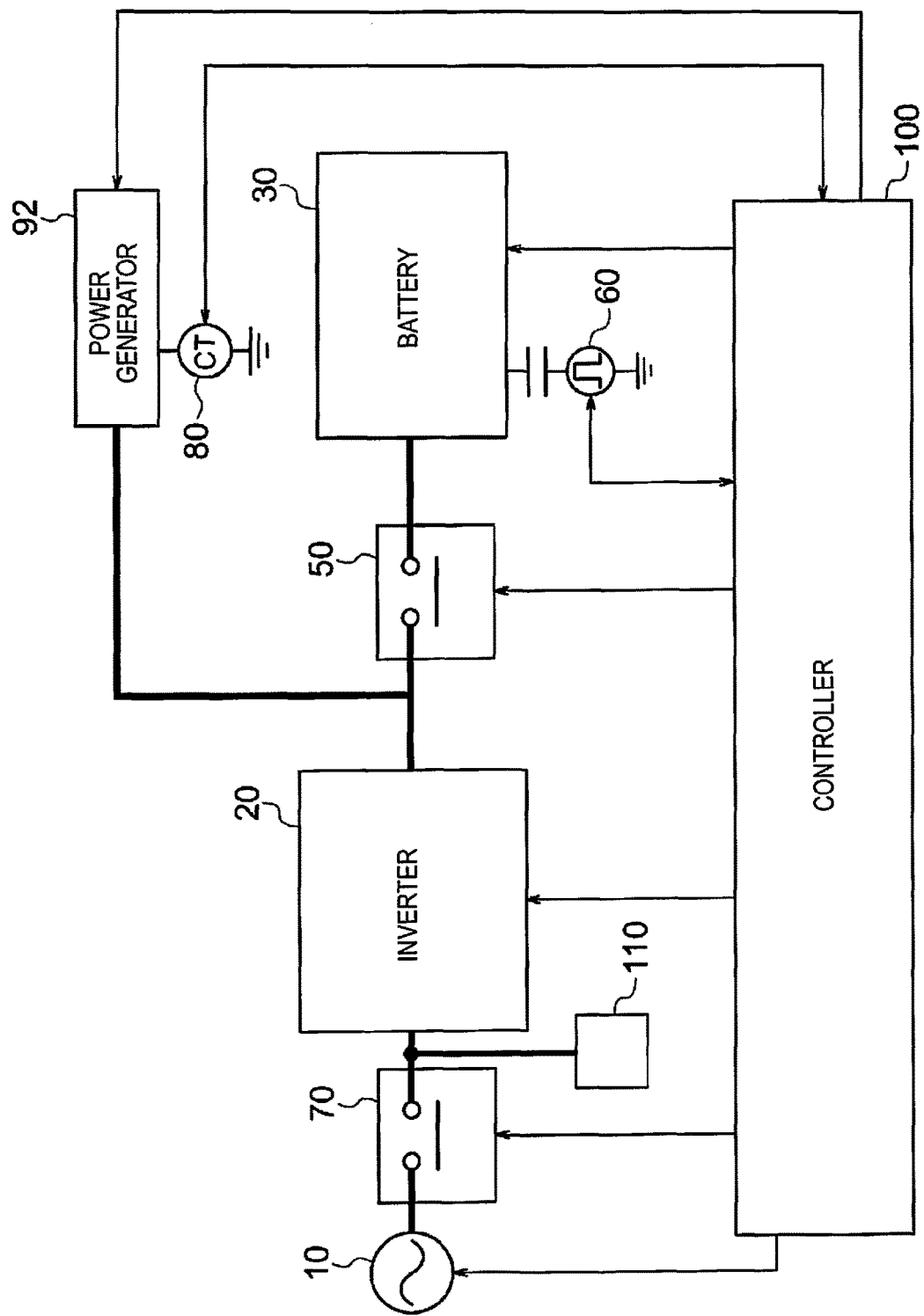
FIG. 5 is a block diagram of the power supply system in FIG. 4.

The electric power grid of the power supply system of the present example will next be described using FIG. 5. FIG. 5 is a block diagram illustrating the electric power grid of the power supply system of FIG. 4. In FIG. 5, thick lines indicate electric power lines (power supply lines) and arrows indicate signal lines.

The alternating-current power source 10, the relay switch 70, the power converter 20, the relay switch 50, the battery 30, and the power generator 92 are connected by electric power lines. The controller 100 controls the alternating-current power source 10, the power converter 20, the battery 30, the relay switch 50, the ground fault sensing circuit 60, the relay switch 70, the electricity leakage sensing circuit 80, and the power generator 92, and is connected by signal lines.

Control of the power supply system of the present example will next be described. The controller 100 switches between a normal control mode, a ground fault sensing mode, and a disconnection sensing mode for sensing a disconnection in the electricity leakage sensing circuit 80, and controls the relay switches 50, 70.

In the normal control mode, the controller 100 turns on the relay switch 50 and the relay switch 70 and controls the alternating-current power source 10 and other components.

In the ground fault sensing mode, the controller 100 turns off at least the relay switch 50, and controls the ground fault sensing circuit 60 to sense a ground fault in the battery 30.

In the disconnection sensing mode, the controller 100 confirms the state of the relay switch 70, and when the relay switch 70 is off, the controller 100 controller performs the disconnection sensing control described below. When the relay switch 70 is on, the controller 100 compares the electric current in the relay switch 70 and the electric current threshold value set in advance. When the electric current in the relay switch 70 is lower than the electric current threshold value, the controller 100 turns off the relay switch 70.

In the state in which the relay switch 70 is off, the controller 100 then turns on the relay switch 50, a pulse signal is outputted from the pulse transmitter 63, and a disconnection in the electricity leakage sensing circuit 80 is sensed from the output of the comparator 67.

When the relay switch 50 is on, the ground fault sensing circuit 60 conducts through the resistors 81, 82 to the grounding point of the electricity leakage sensing circuit 80 via the relay switch 50. Therefore, when there is a disconnection in the electricity leakage sensing circuit 80, the amplitude voltage (response voltage) inputted to the comparator 67 is higher than the reference voltage for the input pulse from the pulse transmitter 63. When there is no disconnection in the electricity leakage sensing circuit 80, the amplitude voltage (response voltage) inputted to the comparator 67 is lower than the reference voltage. The controller 100 can thereby sense that a disconnection has occurred in the electricity leakage sensing circuit 80 if a ground fault is not detected by the ground fault sensing circuit 60 when the relay switch 50 is on.

When it is assessed that a disconnection has occurred in the electricity leakage sensing circuit 80, the controller 100 notifies the user that a disconnection has occurred.

Figure 6:
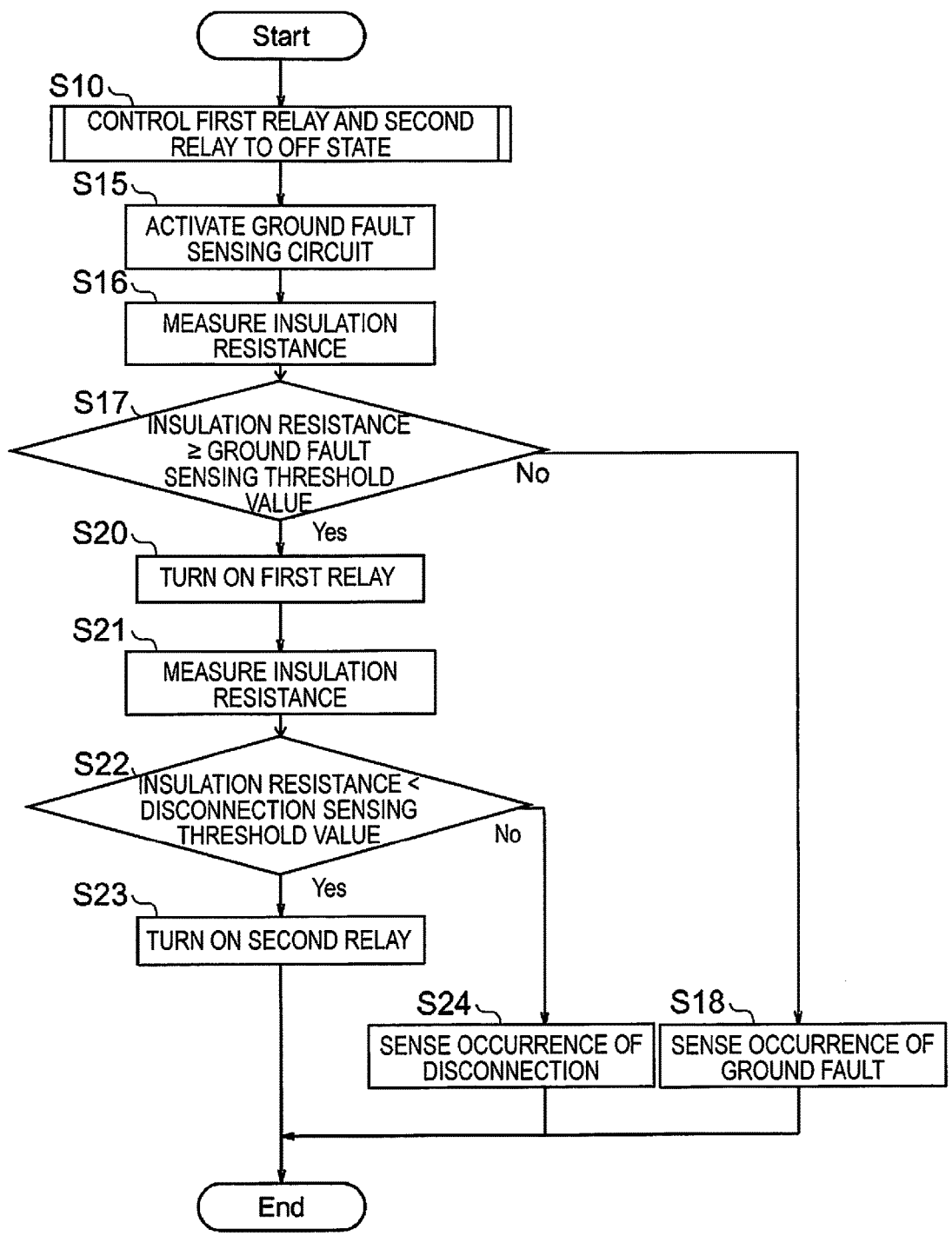
FIG. 6 is a flowchart illustrating the procedure of control performed by the controller in FIG. 5.

The control performed by the controller 100 in the ground fault sensing mode and the disconnection sensing mode will next be described using FIG. 6. FIG. 6 is a flowchart illustrating the procedure of control by the controller 100.

In step S10, control is performed for placing the relay switch 50 and the relay switch 70 in the off state. The control procedure for the relay switch 50 in step S10 is the same as the control procedure of steps S1 through S4 in the first embodiment. The control procedure of steps S1 through S4 may be substituted as the control procedure for the relay switch 70 in step S10. Specifically, the relay switch 50 and the relay switch 70 may both be placed in the off state when it has been confirmed that the flowing electric current is smaller than a predetermined threshold electric current and the effect of placing the relay switch 50 and relay switch 70 in the off state is minimal.

After the control process of step S10, steps S15 through S18 are the same as steps S5 through S8 of the first embodiment, and therefore will not be described.

When the determination of step S17 is that the insulation resistance is equal to or greater than the ground fault sensing threshold value, in step S20, the controller 100 assesses that there is no ground fault in the battery 30, turns on only the relay switch 50 while the relay switch 70 is maintained in the off state, ends the ground fault sensing mode, and transitions to the disconnection sensing mode.

In step S21, the ground fault sensing circuit 60 measures the insulation resistance of the electricity leakage sensing circuit 80 by measuring the response voltage for the pulse of the pulse transmitter 63. In step S22, the ground fault sensing circuit 60 detects whether the insulation resistance of the electricity leakage sensing circuit 80 is less than a disconnection sensing threshold value by comparing the corresponding response voltage and the reference voltage through use of the comparator 67. The disconnection sensing threshold value is a threshold value for assessing whether there is a disconnection in the electricity leakage sensing circuit 80, and is a value set in advance. Consequently, the disconnection sensing threshold value corresponds to the reference voltage and is set to a value higher than the response voltage for a case in which there is no disconnection in at least one of the resistors 81, 82. The disconnection sensing threshold value corresponds to the reference voltage 66, but may be set to a value different from the ground fault sensing threshold value.

When the insulation resistance is less than the disconnection sensing threshold value, in step S23, the controller 100 assesses that there is no disconnection in the electricity leakage sensing circuit 80, turns on the relay switch 70, and ends the disconnection sensing mode.

When the insulation resistance is equal to or greater than the disconnection sensing threshold value, in step S24, it is assessed that a disconnection has occurred in the electricity leakage sensing circuit 80, and the disconnection sensing mode is ended.

As described above, in the present example, the electricity leakage sensing circuit 80 is electrically connected, closer to the power converter 20 than the relay switch 50, to a pair of power supply lines connected between the battery 30 and the power converter 20, and when the relay switch 50 is on, disconnection in the electricity leakage sensing circuit 80 is sensed by the ground fault sensing circuit 60. Disconnection can thereby be sensed without providing a separate dedicated mechanism for sensing disconnection in the electricity leakage sensing circuit 80.

In the present example, when the relay switch 70 is off, disconnection in the electricity leakage sensing circuit 80 is sensed by the ground fault sensing circuit 60. Disconnection in the electricity leakage sensing circuit 80 can thereby be sensed in a state in which the ground fault sensing circuit 60 is reliably cut off from the alternating-current power source 10.

In the case of sensing disconnection in the electricity leakage sensing circuit 80 through use of the ground fault sensing circuit 60, the relay switch 70 is off in the present example, but disconnection may also be sensed in a state in which the plurality of switching elements included in the power converter 20 is off.

The abovementioned relay switch 70 corresponds to the "second switch" of the present invention, the electricity leakage sensing circuit 80 corresponds to the "electricity leakage sensing means or device" of the present invention, and the power generator 92 corresponds to the "power generation means or device" of the present invention.

Third Embodiment

The power supply system of the power supply device according to another embodiment of the present invention will next be described. In the present example, a portion of the control of disconnection sensing in the electricity leakage sensing circuit 80 by the ground fault sensing circuit 60 differs from that of the second embodiment. All other aspects of the configuration of the third embodiment are the same as in the second embodiment, and descriptions thereof will therefore be quoted as appropriate.

When the relay switch 70 is off, the controller 100 specifies a disconnected portion of the electricity leakage sensing circuit 80 by alternately switching the on/off state of a positive-electrode switch 51, which is the switch on the positive-electrode side of the relay switch 50, with the on/off state of a negative-electrode switch 52, which is the switch on the negative-electrode side, and measuring the insulation resistance of the electricity leakage sensing circuit 80.

The controller 100 turns on the positive-electrode switch 51 of the relay switch 50 and turns off the negative-electrode switch 52 thereof, a pulse signal is outputted from the pulse transmitter 63, and disconnection in the electricity leakage sensing circuit 80 is sensed from the output of the comparator 67.

When positive-electrode switch 51 is on and the negative-electrode switch 52 is off, the ground fault sensing circuit 60 conducts through the resistor 81 on the positive-electrode side to the grounding point of the electricity leakage sensing circuit 80 via the positive-electrode switch 51. On the negative-electrode side, since the negative-electrode switch 52 is off, the ground fault sensing circuit 60 does not conduct with the resistor 82 on the negative-electrode side.

In this state, when there is a disconnection in the resistor 81 portion, the amplitude voltage inputted to the comparator 67 is higher than the reference voltage for the input pulse from the pulse transmitter 63. Similarly, the amplitude voltage inputted to the comparator 67 is higher than the reference voltage also when a disconnection has occurred in the grounding portion of the electricity leakage sensing circuit 80. When there is no disconnection in the resistor 81 portion and the grounding portion of the electricity leakage sensing circuit 80, the amplitude voltage inputted to the comparator 67 is lower than the reference voltage. It is thereby possible to sense an abnormality on the positive-electrode side of the electricity leakage sensing circuit 80 in the present example.

The controller 100 turns off the positive-electrode switch 51 of the relay switch 50 and turns on the negative-electrode switch 52 thereof, a pulse signal is outputted from the pulse transmitter 63, and disconnection in the electricity leakage sensing circuit 80 is sensed from the output of the comparator 67.

When positive-electrode switch 51 is off and the negative-electrode switch 52 is on, the ground fault sensing circuit 60 conducts through the resistor 82 on the negative-electrode side to the grounding point of the ground fault sensing circuit via the negative-electrode switch 52. On the positive-electrode side, since the positive-electrode switch 51 is off, the ground fault sensing circuit 60 does not conduct with the resistor 81 on the positive-electrode side.

In this state, when there is a disconnection in the resistor 82 portion, the amplitude voltage inputted to the comparator 67 is higher than the reference voltage for the input pulse from the pulse transmitter 63. Similarly, the amplitude voltage inputted to the comparator 67 is higher than the reference voltage also when a disconnection has occurred in the grounding portion of the electricity leakage sensing circuit 80. When there is no disconnection in the resistor 82 portion and the grounding portion of the electricity leakage sensing circuit 80, the amplitude voltage inputted to the comparator 67 is lower than the reference voltage. It is thereby possible to sense an abnormality on the negative-electrode side of the electricity leakage sensing circuit 80 in the present example.

The controller 100 can then distinguishably sense disconnection in the resistor 81, disconnection in the resistor 82, and disconnection and non-disconnection (normal state) in the grounding portion of the electricity leakage sensing circuit 80 by combining the disconnection sensing result when the positive-electrode switch 51 is on and the negative-electrode switch 52 is off and the disconnection sensing result when the positive-electrode switch 51 is off and the negative-electrode switch 52 is on.

Table 1 illustrates the results of disconnection sensing with respect to the state of the positive-electrode switch 51 and the state of the negative-electrode switch 52, and to the result of measuring the insulation resistance.

TABLE 1

| | Positive-electrode switch/ Negative-electrode switch ON/OFF | |
|---|---|---|
| | ○ | X |
| Positive-electrode switch/Negative-electrode switch OFF/ON | ○ Normal | Positive-electrode side abnormality |
| | X Negative-electrode side abnormality | Grounding abnormality |

In Table 1, ON and OFF for the positive-electrode switch/negative-electrode switch indicate the on state and off state, respectively, of the switches 51, 52. For the positive-electrode switch and negative-electrode switch, ON/OFF indicates the on state for the positive-electrode switch 51 and the off state for the negative-electrode switch 52. For the positive-electrode switch and negative-electrode switch, OFF/ON indicates the off state for the positive-electrode switch 51 and the on state for the negative-electrode switch 52. A circle indicates a case in which the insulation resistance measured by the ground fault sensing circuit 60 is less than the disconnection sensing threshold value, and an x-mark indicates a case in which the insulation resistance measured by the ground fault sensing circuit 60 is equal to or greater than the disconnection sensing threshold value.

As illustrated in Table 1, when the positive-electrode switch 51 is on and the negative-electrode switch 52 is off, and the amplitude voltage (corresponding to the voltage sensed by the ground fault sensing circuit 60) inputted to the comparator 67 is less than the reference voltage for the input pulse from the pulse transmitter 63, and when the positive-electrode switch 51 is off and the negative-electrode switch 52 is on, and the amplitude voltage inputted to the comparator 67 is less than the reference voltage, the resistance values of the resistors 81, 82 and the grounding portion are not elevated, and the controller 100 therefore assesses that the electricity leakage sensing circuit 80 is normal.

When the positive-electrode switch 51 is on and the negative-electrode switch 52 is off, and the amplitude voltage inputted to the comparator 67 is equal to or greater than the reference voltage, and when the positive-electrode switch 51 is off and the negative-electrode switch 52 is on, and the amplitude voltage inputted to the comparator 67 is less than the reference voltage, the resistance values of the resistor 82 and the grounding portion are not elevated, but the resistance value of the resistor 81 is elevated. Therefore, the controller 100 assesses that a disconnection has occurred in the resistor 81, and assesses that there is an abnormality on the positive-electrode side of the electricity leakage sensing circuit 80.

When the positive-electrode switch 51 is on and the negative-electrode switch 52 is off, and the amplitude voltage inputted to the comparator 67 is less than the reference voltage, and when the positive-electrode switch 51 is off and the negative-electrode switch 52 is on, and the amplitude voltage inputted to the comparator 67 is equal to or greater than the reference voltage, the resistance values of the resistor 81 and the grounding portion are not elevated, but the resistance value of the resistor 82 is elevated. Therefore, the controller 100 assesses that a disconnection has occurred in the resistor 82, and assesses that there is an abnormality on the negative-electrode side of the electricity leakage sensing circuit 80.

When the positive-electrode switch 51 is on and the negative-electrode switch 52 is off, and the amplitude voltage inputted to the comparator 67 is equal to or greater than the reference voltage, and when the positive-electrode switch 51 is off and the negative-electrode switch 52 is on, and the amplitude voltage inputted to the comparator 67 is equal to or greater than the reference voltage, the resistance values of the resistors 81, 82 are not elevated, but the resistance value of the grounding portion is elevated. Therefore, the controller 100 assesses that a disconnection has occurred in the grounding portion, and assesses that there is an abnormality in the grounding portion of the electricity leakage sensing circuit 80.

In the present example, the switches are switched so that the on/off state of the positive-electrode switch 51 and the on/off state of the negative-electrode switch 52 are interchanged, the reference voltage and the voltage sensed by the ground fault sensing circuit (device) are compared, and sensing can be performed after distinguishing among abnormality in the positive-electrode side, abnormality in the negative-electrode side, abnormality in the grounding of the electricity leakage sensing circuit 80, and normal operation of the electricity leak sensing circuit according to the conditions illustrated in Table 1.

The invention claimed is:

1. A power supply device comprising:
   an alternating-current power source;
   a secondary cell connected to the alternating-current power source;
   a first switch configured to selectively connect or turn off the secondary cell and the alternating-current power source, the first switch being disposed between the secondary cell and the alternating-current power source; and
   a ground fault sensing device configured to sense a ground fault in the secondary cell, the ground fault sensing device being connected closer to the secondary cell than the first switch,
   the ground fault sensing device configured to sense a ground fault in the secondary cell by sensing a reduction in insulation of the secondary cell when the first switch is off.

2. The power supply device of claim 1, wherein
   the secondary cell is connected to the alternating-current power source via a power converter configured to convert alternating-current electric power supplied from the alternating-current power source into direct-current electric power and output the direct-current electric power, and
   the first switch is disposed between the secondary cell and the power converter.

3. The power supply device of claim 2, further comprising
   an electricity leakage sensing device configured to sense an electricity leakage by comparing an electric current on a positive-electrode side and an electric current on a negative-electrode side, the electricity leakage sensing device being electrically connected closer to the power converter than the first switch, and being connected to a pair of power supply lines connected between the secondary cell and the power converter, and
   the ground fault sensing device being configured to sense a disconnection in the electricity leakage sensing device when the first switch is on.

4. The power supply device of claim 3, further comprising
   a power supply unit electrically connected closer to the power converter than the first switch, and
   the electricity leakage sensing device being configured to sense an electricity leak in the power supply unit.

5. The power supply device of claim 3, further comprising
a controller programmed to control the first switch and the ground fault sensing device,
the first switch having a positive-electrode switch connected to a positive electrode of the secondary cell and a negative-electrode switch connected to a negative electrode of the secondary cell, and
the controller programmed to assess whether the electricity leakage sensing device is normal when the voltage sensed by the ground fault sensing device is less than a predetermined voltage threshold value in a state in which the positive-electrode switch is turned on and the negative-electrode switch is turned off, and when the voltage sensed by the ground fault sensing device is less than the predetermined voltage threshold value in a state in which the positive-electrode switch is turned off and the negative-electrode switch is turned on,
assess whether there is an abnormality on the positive-electrode side of the electricity leakage sensing device when the voltage sensed by the ground fault sensing device is equal to or greater than the predetermined voltage threshold value in a state in which the positive-electrode switch is turned on and the negative-electrode switch is turned off, and when the voltage sensed by the ground fault sensing device is less than the predetermined voltage threshold value in a state in which the positive-electrode switch is turned off and the negative-electrode switch is turned on,
assess whether there is an abnormality on the negative-electrode side of the electricity leakage sensing device when the voltage sensed by the ground fault sensing device is less than the predetermined voltage threshold value in a state in which the positive-electrode switch is turned on and the negative-electrode switch is turned off, and when the voltage sensed by the ground fault sensing device is equal to or greater than the predetermined voltage threshold value in a state in which the positive-electrode switch is turned off and the negative-electrode switch is turned on, and
assess whether there is an abnormality in grounding of the electricity leakage sensing device when the voltage sensed by the ground fault sensing device is equal to or greater than the predetermined voltage threshold value in a state in which the positive-electrode switch is turned on and the negative-electrode switch is turned off, and when the voltage sensed by the ground fault sensing device is equal to or greater than the predetermined voltage threshold value in a state in which the positive-electrode switch is turned off and the negative-electrode switch is turned on.

6. The power supply device of claim 3, further comprising
a second switch connected between the alternating-current power source and the power converter,
the ground fault sensing device configured to sense a disconnection in the electricity leakage sensing device when the second switch is off.

7. The power supply device of claim 2, wherein
the ground fault sensing device is configured to sense a ground fault in the secondary cell when each of a plurality of switching devices included in the power converter is off.

8. The power supply device of claim 1, further comprising
a controller programmed to control the first switch and the ground fault sensing device, and being programmed to turn off the first switch at least once per a predetermined time and to cause sensing of a ground fault in the secondary cell.

9. The power supply device of claim 1, further comprising
a controller programmed to control the first switch and the ground fault sensing device, and
being programmed to turn off the first switch and to cause sensing of a ground fault in the secondary cell when a time block using the alternating-current power source is a nighttime electric power time block.

10. The power supply device of claim 1, wherein
the ground fault sensing device
has a capacitor, one end of the capacitor being connected to the secondary cell,
the capacitor being configured to apply a pulse having a predetermined voltage amplitude to a measurement point which is the other end of the capacitor, and
to sense a ground fault in the secondary cell when an amplitude of a voltage occurring at the measurement point is lower than a predetermined reference voltage set in advance.

11. The power supply device of claim 4, further comprising
a controller programmed to control the first switch and the ground fault sensing device,
the first switch having a positive-electrode switch connected to a positive electrode of the secondary cell and a negative-electrode switch connected to a negative electrode of the secondary cell, and
the controller programmed to assess whether the electricity leakage sensing device is normal when the voltage sensed by the ground fault sensing device is less than a predetermined voltage threshold value in a state in which the positive-electrode switch is turned on and the negative-electrode switch is turned off, and when the voltage sensed by the ground fault sensing device is less than the predetermined voltage threshold value in a state in which the positive-electrode switch is turned off and the negative-electrode switch is turned on,
assess whether there is an abnormality on the positive-electrode side of the electricity leakage sensing device when the voltage sensed by the ground fault sensing device is equal to or greater than the predetermined voltage threshold value in a state in which the positive-electrode switch is turned on and the negative-electrode switch is turned off, and when the voltage sensed by the ground fault sensing device is less than the predetermined voltage threshold value in a state in which the positive-electrode switch is turned off and the negative-electrode switch is turned on,
assess whether there is an abnormality on the negative-electrode side of the electricity leakage sensing device when the voltage sensed by the ground fault sensing device is less than the predetermined voltage threshold value in a state in which the positive-electrode switch is turned on and the negative-electrode switch is turned off, and when the voltage sensed by the ground fault sensing device is equal to or greater than the predetermined voltage threshold value in a state in which the positive-electrode switch is turned off and the negative-electrode switch is turned on, and
assess whether there is an abnormality in grounding of the electricity leakage sensing device when the voltage sensed by the ground fault sensing device is equal to or greater than the predetermined voltage threshold value in a state in which the positive-electrode switch is turned on and the negative-electrode switch is turned off, and when the voltage sensed by the ground fault sensing device is equal to or greater than the predetermined voltage threshold value in a state in which the positive-electrode switch is turned off and the negative-electrode switch is turned on.

12. The power supply device of claim 4, further comprising
a second switch connected between the alternating-current power source and the power converter,
the ground fault sensing device configured to sense a disconnection in the electricity leakage sensing device when the second switch is off.

13. The power supply device of claim 5, further comprising
a second switch connected between the alternating-current power source and the power converter,
the ground fault sensing device configured to sense a disconnection in the electricity leakage sensing device when the second switch is off.

14. The power supply device of claim 3, wherein
the ground fault sensing device is configured to sense a ground fault in the secondary cell when each of a plurality of switching devices included in the power converter is off.

15. The power supply device of claim 4, wherein
the ground fault sensing device is configured to sense a ground fault in the secondary cell when each of a plurality of switching devices included in the power converter is off.

16. The power supply device of claim 5, wherein
the ground fault sensing device is configured to sense a ground fault in the secondary cell when each of a plurality of switching devices included in the power converter is off.

17. The power supply device of claim 6, wherein
the ground fault sensing device is configured to sense a ground fault in the secondary cell when each of a plurality of switching devices included in the power converter is off.

18. The power supply device of claim 4, further comprising
a controller programmed to control the first switch and the ground fault sensing device, and being programmed to turn off the first switch at least once per a predetermined time and to cause sensing of a ground fault in the secondary cell.

19. The power supply device of claim 4, further comprising
a controller programmed to control the first switch and the ground fault sensing device, and being programmed to turn off the first switch and to cause sensing of a ground fault in the secondary cell when a time block using the alternating-current power source is a nighttime electric power time block.

20. The power supply device of claim 4, wherein
the ground fault sensing device
has a capacitor, one end of the capacitor being connected to the secondary cell,
the capacitor being configured to apply a pulse having a predetermined voltage amplitude to a measurement point which is the other end of the capacitor, and
to sense a ground fault in the secondary cell when an amplitude of a voltage occurring at the measurement point is lower than a predetermined reference voltage set in advance.

21. The power supply device of claim 1, wherein
the ground fault sensing device is configured to sense the ground fault in the secondary cell when the secondary cell and the alternating-current power source are disconnected.

* * * * *